United States Patent [19]
Tsuneta et al.

[11] Patent Number: 5,453,617
[45] Date of Patent: Sep. 26, 1995

[54] ELECTRON MICROSCOPE FOR SPECIMEN COMPOSITION AND STRAIN ANALYSIS AND OBSERVATION METHOD THEREOF

[75] Inventors: Ruriko Tsuneta, Kokubunji; Hiroshi Kakibayashi, Nagareyama, both of Japan

[73] Assignee: Hitachi, Ltd., Tokyo, Japan

[21] Appl. No.: 262,540

[22] Filed: Jun. 20, 1994

[30] Foreign Application Priority Data

Jun. 21, 1993 [JP] Japan ................... 5-148853

[51] Int. Cl.$^6$ ................................ H01J 37/26
[52] U.S. Cl. ..................... 250/311; 250/442.11
[58] Field of Search ............... 250/311, 442.11, 250/308, 307

[56] References Cited

U.S. PATENT DOCUMENTS 4,146,788  3/1979  Mirkin et al. ................ 250/311

FOREIGN PATENT DOCUMENTS 62-26755  2/1987  Japan .
5-92949  12/1993  Japan .
5-92950  12/1993  Japan .

OTHER PUBLICATIONS

Japanese Journal of Applied Physics, vol. 26, No. 5, May 1987, Kakibayashi et al., pp. 770–771. "Observation of Fine Compositional Fluctuation in GaAs/ACx $Ga_{1-x}$ as Superstructure using Composition Analysis by Thickness Fringe (CAT) Method".

Japanese Journal of Applied Physics, vol. 30, No. 1A, Jan. 1991, Kakibayashi et al., pp. L52–L55. "Direct Observation of Stain Distribution in InP/$In_{1-x}$, $Ga_xP$ Heterointerfaces by the Compositional Analysis by Thickness Fringe Method". Japanese Journal of Applied Physics, vol. 25, No. 11, Nov., 1986, Kakibayashi et al., pp. 1644–1649. "Limitation Studies of a Composition Analysis by Thickness Fringe (CAT) in an Electron Microscope Image of GaAs/$Al_xGa_{1-x}$ as Superstructure".

N. Tanaka et al., "Detection of Strain in InP/InGaP Superlattices by Dark-Field Electron Microscopy and Nano–Diffraction Technique", Japanese Journal of Applied Physics, vol. 30, No. 6A, Jun. 1991, pp. L959–L962.

*Primary Examiner*—Jack I. Berman
*Assistant Examiner*—Kiet T. Nguyen
*Attorney, Agent, or Firm*—Fay, Sharpe, Beall, Fagan, Minnich & McKee

[57] ABSTRACT

A composition change and a 3-dimensional strained structure in an interface or thin film of a layered thin film specimen are detected with a resolution of atom order and quantitatively analyzed. An accelerated electron beam is impinged upon a specimen cleaved in a wedge form. An equal thickness fringe appearing on a transmitted image is detected. By utilizing such a phenomenon that the distance t of the equal thickness fringe is changed by a lattice plane inclination, angle distribution of lattice plane inclination is measured. An analysis of the strained structure is made. Furthermore, processing is conducted so that the equal thickness fringe may represent only the composition change, and a quantitative analysis of the composition distribution is also made. By estimating the composition change and strained structure in the heterointerface and thin film with a resolution of atom order, relations between characteristics and the composition change and strained structure of a strained superlattice device or the like can be elucidated. Thus, not only defective analysis can be made, but also information concerning optimization of the process condition and device structure is obtained.

22 Claims, 12 Drawing Sheets

FIG. 5
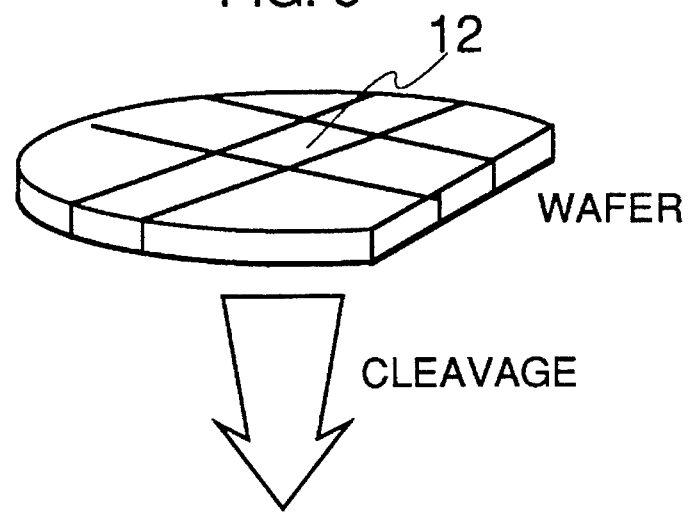
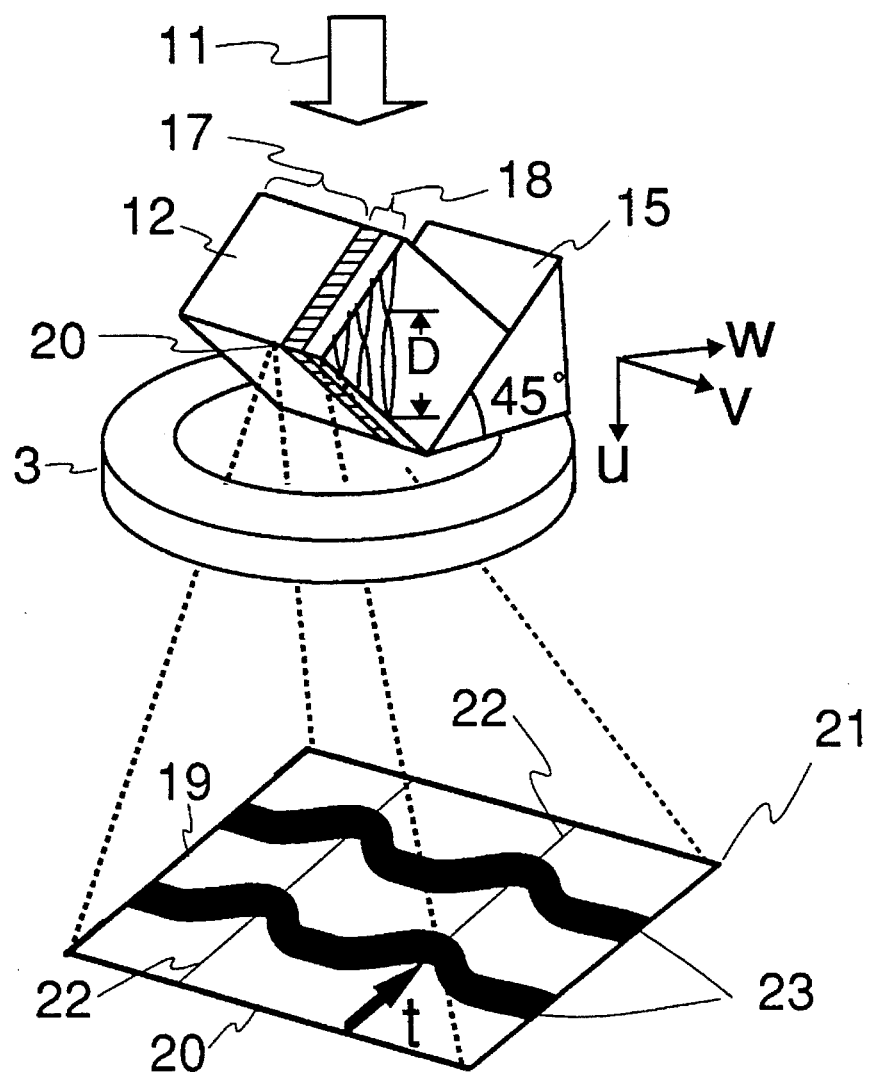

FIG. 7 A
FIG. 7 B
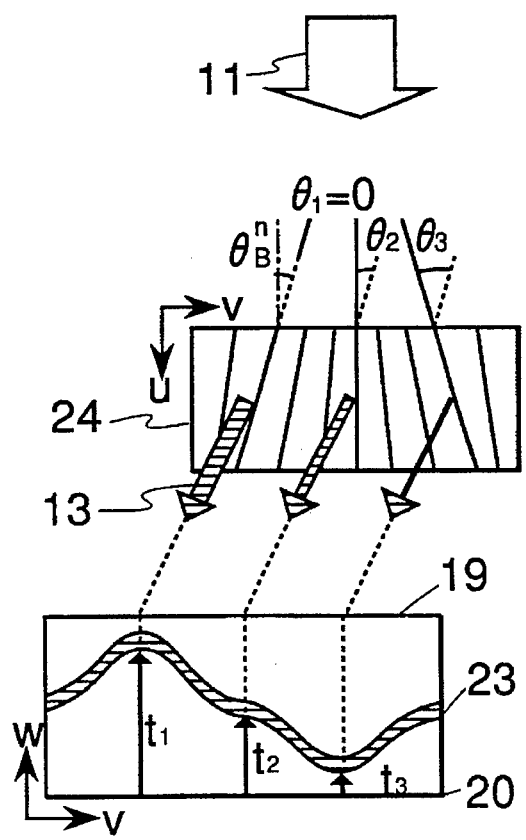
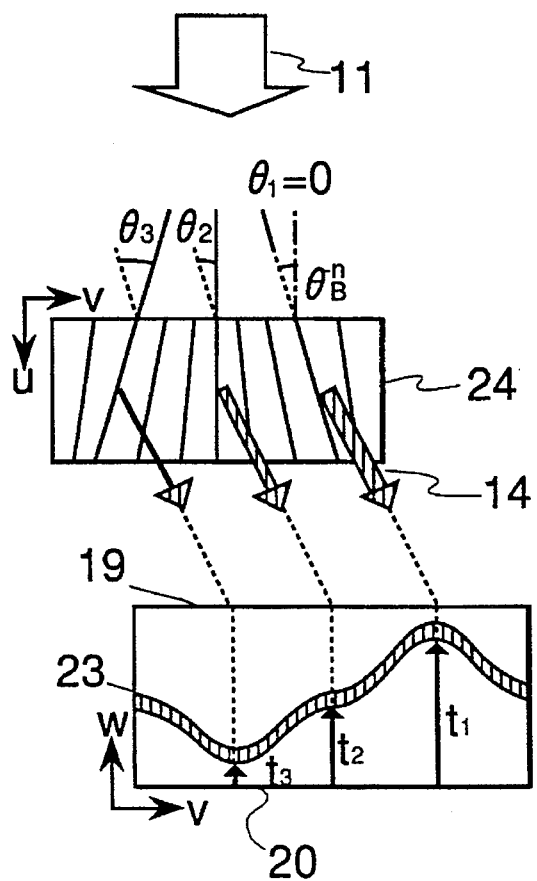

FIG.13A PRIOR ART
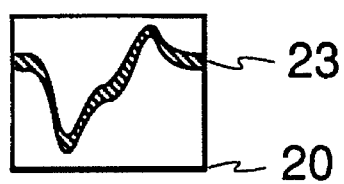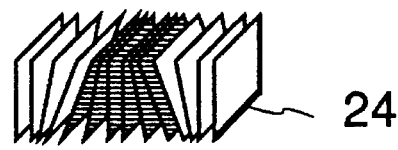
FIG.13B
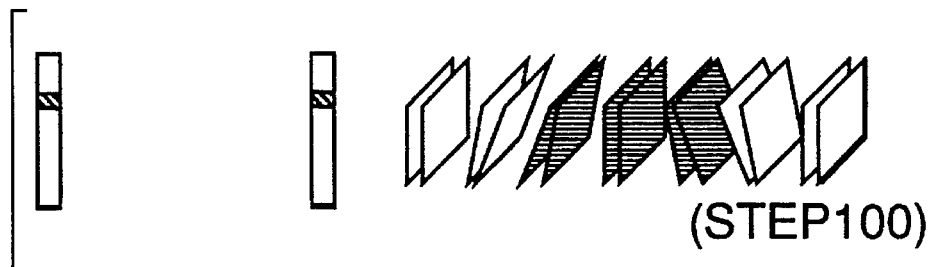
(STEP100)
(STEP101)
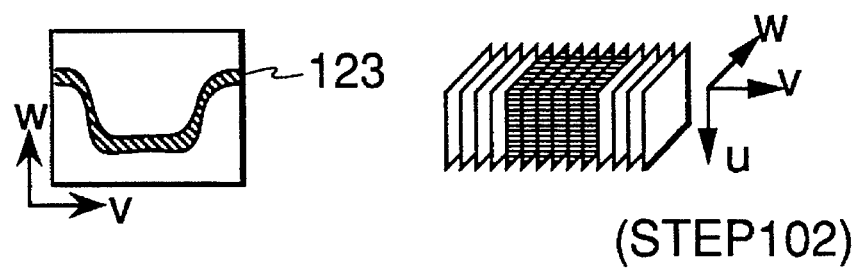
(STEP102)

ELECTRON MICROSCOPE FOR SPECIMEN COMPOSITION AND STRAIN ANALYSIS AND OBSERVATION METHOD THEREOF

BACKGROUND OF THE INVENTION

The present invention relates to an electron microscope apparatus for composition and strain analysis and an observation method thereof for providing guides to process check, optimization, and device design by analyzing quantitatively composition and strained structure of corpuscles located in a heterointerface or a thin film of a device formed by crystalline growth, especially a device utilizing a strained superlattice such as a high mobility transistor or a super-high-speed semiconductor laser.

For evaluating the composition distribution and strained structure in a thin film or in the vicinity of a heterointerface of a strained superlattice device, there is needed a technique capable of measuring the composition and strained structure with a high depth resolution while keeping association with the cross-sectional structure of the device. In order to satisfy this need, several measuring methods using an electron microscope have heretofore been invented. For example, in "Method for quantitatively analyzing composition by using electron microscope" described in JP-A-62-26755, composition changes in a thin film or in the vicinity of a heterointerface are measured by impinging an electron beam upon a specimen cleaved in a wedge form, obtaining a bright-field image formed by its transmitted wave, detecting an equal thickness fringe appearing on the image, and utilizing such a phenomenon that intensity distribution of the equal thickness fringe is changed according to composition. Furthermore, in a strain measuring method described in Japanese Journal of Applied Physics, Vol. 30, 1991, pp. L52–L55, strain distribution is measured as an amount of inclination of a lattice plane by using a bright-field image and such a phenomenon that intensity distribution of the equal thickness fringe is changed by a slight inclination of the lattice plane caused by lattice strain.

According to the above described composition distribution measuring method, composition distribution can be determined beforehand for an unstrained specimen on the basis of a change in intensity distribution of the equal thickness fringe. Whether there is bending or not in the lattice plane and its angle distribution can be determined, only in case where the structure factor is similar between thin films and the intensity distribution of the equal thickness fringe does not change even if the composition is changed. This method can be applied to only specimens placed under restricted conditions.

Furthermore, even if the above described two conventional techniques are used, it is impossible to measure separately the composition distribution and strain distribution in one specimen.

Furthermore, according to the above described strain distribution measuring method, measurements are made with a bright-field image, and hence only averaged information is obtained with respect to the inclination angle of the lattice plane of each plane index. Therefore, it is impossible to analyze dependence of the inclination of the lattice plane (direction of inclination) upon the plane index or analyze 3-dimensional strained structure. Furthermore, in a bright-field image, a change of intensity distribution of the equal thickness fringe as a function of the inclination value of the lattice plane is determined by crystal composition. Therefore, it is difficult to improve the measurement sensitivity of the inclination angle of the lattice plane.

Furthermore, according to the above described conventional techniques, the observer measures, on a photograph, intensity distribution of an equal thickness fringe appearing on an electron microscope image of a wedge-shaped specimen, compares the intensity distribution with intensity distribution of a calculated image obtained by using the electron diffraction theory, and thus makes a quantitative analysis of composition or strain distribution. Therefore, a skilled observer is needed for image analysis. In addition, it is also difficult for persons other than the observer to understand the result of analysis.

SUMMARY OF THE INVENTION

An object of the present invention is to provide an apparatus and a method for quantitatively analyzing the inclination angle distribution of the lattice plane of each plane index even in a typical specimen including a mixture of composition distribution and strain distribution by analyzing dark-field images of various plane indexes while tilting the specimen in various directions, for reconstructing that equal thickness fringe with the influence of strain removed by using the result of analysis, for analyzing the composition distribution, and for making a display in such a form that even persons other than skilled in the art can easily understand it.

An electron microscope is provided with a special purpose implement having a spring plate to fix a wedge-shaped specimen, a specimen holder having a specimen cooling system for reducing specimen damage caused by electron illumination and a double tilt system controlled by a processor, an objective aperture capable of moving to positions of a desired diffracted wave and a transmitted wave at high speed, an electron beam detector capable of taking in an image in synchronism with movement of the objective aperture, and a processor for controlling the objective aperture and the electron beam detector so that bright-field image and a plurality of dark-field images may be observed by a single apparatus. The processor is provided with means for conducting image processing on an equal thickness fringe appearing on the electron microscope image.

A specimen is cleaved in a wedge form, fixed on the specimen holder, and subjected to electron illumination. By utilizing the position relation between the Kikuchi lines pattern and the diffraction spot on the diffraction pattern, the specimen is tilted by the tilt system so that the khl lattice plane in an unstrained region of a substrate or the like may become parallel to the electron beam. While keeping this tilt, an electron beam is impinged upon an observation subject, i.e., a crystal formed on the substrate. A diffraction spot having a plane index hkl and a diffraction spot having an opposite plane index -h-k-l are selected. By using the above described objective aperture and a control system of the electron beam detector, both a hkl dark-field image and a -h-k-l dark-field image are observed. If there is a difference between an equal thickness fringe on the hkl dark-field image and an equal thickness fringe on the -h-k-l dark-field image, it can be determined that a (hkl) lattice plane of that region is inclined.

Then, an observed region is divided into segments in the growth direction by using image processing, and the inclination angle of the lattice plane in each segment is measured. There are two methods for measuring the difference of the inclination angle of the lattice plane between a strained region and an unstrained region. According to one of the two methods, a measurement is made by tilting the specimen while comparing intensity distribution of the equal thickness fringe on the hkl dark-field image with intensity distribution of the equal thickness fringe on the -h-k-l dark-field image and detecting the inclination angle of the specimen when both have coincided with each other.

According to the other of the two methods, such a phenomenon that the intensity distribution of the equal thickness fringe on the khl dark-field image has a maximum if the (khl) lattice plane satisfies the Bragg condition with respect to an incident electron beam is used, and a measurement is made by detecting the inclination angle of the specimen when the intensity distribution of the equal thickness fringe on the hkl dark-field image has a maximum while tilting the specimen.

By making the above described measurements for various plane indexes and synthesizing results of measurements of inclination angle distribution of lattice plane for plane indexes, information of 3-dimensional strained structure is obtained.

Then, by using the strain distribution measured according to the above described method, i.e., inclination angle distribution of the lattice plane, an equal thickness fringe without the influence of strain removed is reconstructed from the intensity distribution change of the equal thickness fringe on the bright-field image and the composition change is analyzed according to the conventional method. Furthermore, an analysis of composition change without the influence of strain can be made from the intensity distribution change of the equal thickness fringe of the dark-field image as well in the same way.

A quantitative analysis of composition and strain and improvement of its precision are attained by making a comparison of the degree of coincidence between the intensity distribution of the equal thickness fringe calculated by using the theory of electron diffraction for the crystal model having assumed composition and strain distribution and the above described intensity distribution measured actually. Results of analysis thus obtained are displayed on a CRT as a 3-dimensional lattice model and a line profile so as to correspond to the cross-sectional structure of the specimen.

By using a spring plate instead of an adhesive to fix a specimen, degradation of vacuum in a specimen chamber can be prevented. Furthermore, since damage of the specimen caused by the incident electron beam can be decreased by providing a specimen cooling system in the specimen holder, it also becomes possible to observe a dark-field image of high order needing an increase of the amount of incidence electron illumination.

By providing means making it possible to observe both the dark-field image and bright-field image having different plane indexes by means of a single apparatus, it can be determined in a short time which plane index provides a highly sensitive, clear and optimum dark-field image or bright-field image for observing the composition and strain.

Shortening of the observation time is effective for reduction of damage of the specimen caused by electron illumination as well. Furthermore, since dark-field images and bright-field images of a plurality of plane indexes can be observed under the same specimen condition, the measurement precision of the composition distribution and inclination angle distribution of the lattice plane is also improved.

By using, in analyzing the inclination angle distribution of the lattice plane, equal thickness fringes on dark-field images of various plane indexes measured at various specimen inclination angles, it becomes possible to make an analysis on the inclination angle distribution of the lattice plane in typical specimens having a mixture of a composition change and strain, which has been impossible in the conventional technique. Furthermore, by using dark-field images, the inclination angle distribution of the lattice plane for each plane index can be measured separately and 3-dimensional information of the strained structure, which cannot be obtained when the conventional technique is used, can be obtained. Furthermore, if dark-field images of high order are used, the intensity of the electron beam of the diffracted wave becomes weak, but the change value of the intensity distribution of the equal thickness fringe with respect to the inclination angle of the lattice plane increases, resulting in an improved measurement sensitivity of the inclination angle distribution of the lattice plane.

Since the above described analysis process is conducted by using observation means for conducting image processing mounted on the processor attached to the microscope, a skilled observer is not needed unlike the conventional technique. Furthermore, since results of analysis of composition and strain are displayed on a CRT as a line profile and a 3-dimensional lattice model so as to correspond to the cross-sectional structure of the specimen, in which interface position of a layered structure and in which distribution, for example, the composition and strain have changed can be easily understood.

BRIEF DESCRIPTION OF THE DRAWINGS

These and other objects and technical advantages of the present invention will be readily apparent from the following description of the preferred exemplary embodiments of the invention in conjunction with the accompanying drawings, in which:

FIG. 5 is a diagram showing a transmission image obtained when an electron beam is incident upon a wedge-shaped specimen;

FIGS. 7A and 7B are diagrams showing the distance of the equal thickness fringe on dark-field images of opposite plane indexes in a specimen having a lattice plane partially inclined;

FIG. 13A is a diagram showing an equal thickness fringe obtained when a strained specimen is observed by using a conventional method; and FIG. 13B is a diagram showing a method for reconstructing an equal thickness fringe with the influence of strain removed.

DESCRIPTION OF THE PREFERRED EMBODIMENTS

Figure 1:
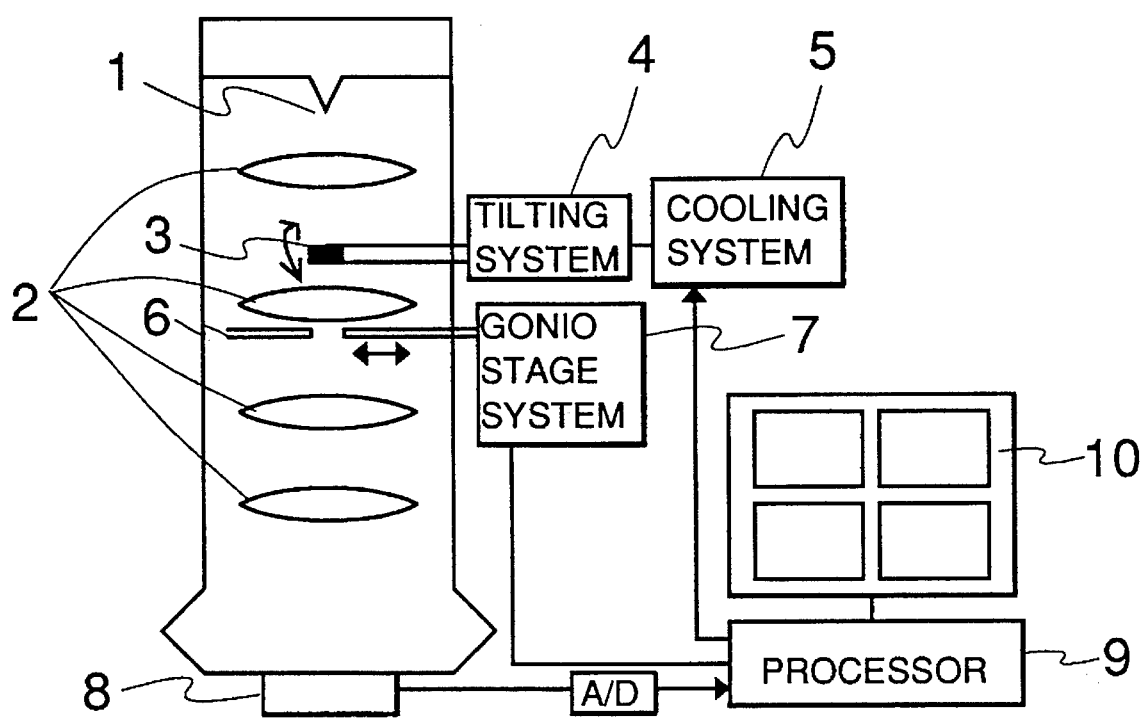
FIG. 1 is an entire configuration diagram showing an embodiment of the present invention.

Hereafter, embodiments of the present invention will be described by referring to drawings. FIG. 1 shows the basic configuration of an embodiment of an electron microscope according to the present invention. The apparatus includes a thermal field emission electron gun 1, an electronic lens 2, a double tilt specimen holder 3, a specimen cooling system 4, a specimen tilting system 5, an objective aperture 6, an objective aperture gonio stage system 7, an electron beam detector 8, a processor for control and image processing 9, and an image display device 10.

Figure 2A:
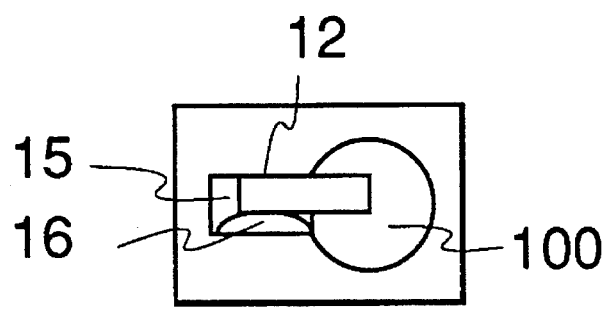
FIG. 2A is a top view of a specimen holder.
Figure 2B:
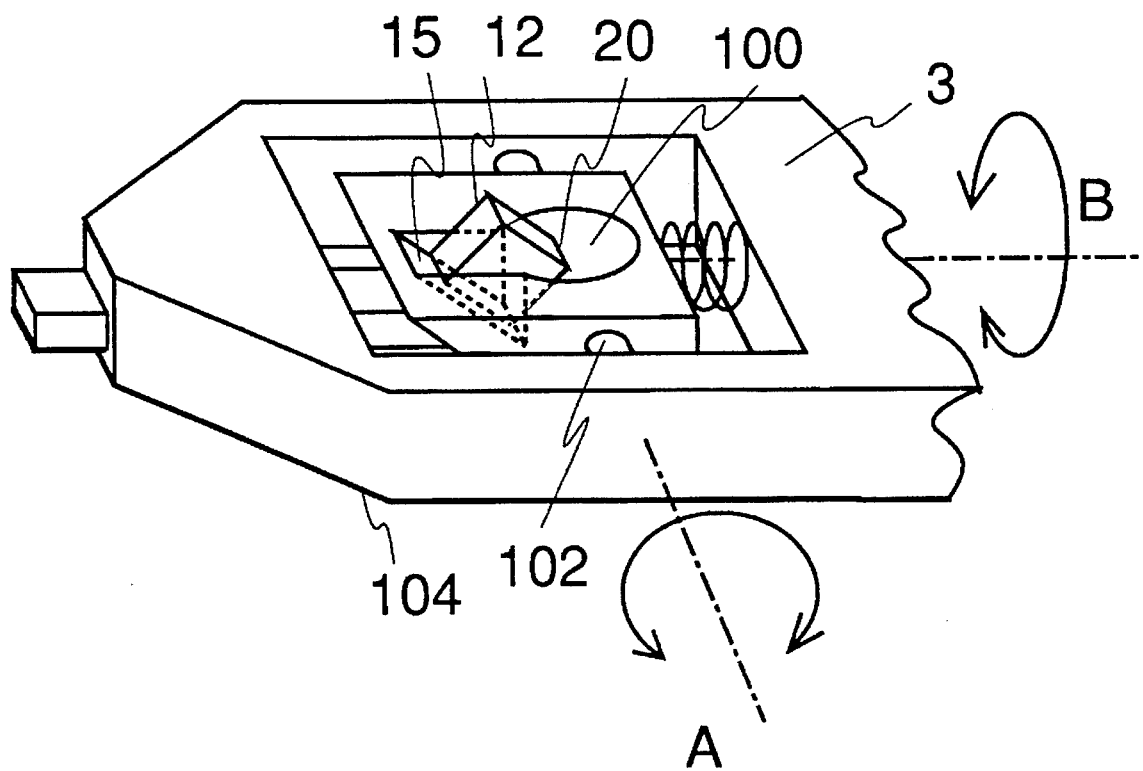
FIG. 2B is an oblique view of the specimen holder attached to an outer frame.

As the electron beam source, the thermal field emission electron gun 1 having high luminance is used. For the specimen holder 3, the specimen cooling system 4 for preventing damage of the specimen caused by illumination of a high-density electron beam is provided. As the electron gun 1, the electronic lens 2, the holder 3, the aperture 6, and the detector 8, corresponding components of a transmission electron microscope (model H-800) produced by Hitachi Ltd. can be used. In this case, acceleration voltage of electron beam is 200 kV and the current value on the specimen is $10^{-9}$ A. As shown in FIGS. 2A and 2B, the specimen holder 3 has a hole 100 for passing the electron beam therethrough and a slant face 15 for placing a specimen 12 thereon. The slant face 15 has an angle of nearly 45 degrees with respect to the illumination axis of the electron beam. By placing one cleavage plane of the specimen 12 on the slant face, an edge of another cleavage plane of the specimen 12 is positioned nearly in the center of the hole 100 and an electron beam is impinged upon the cleavage plane. Since cleavage planes of the specimen 12 are substantially perpendicular to each other, the cleavage plane subjected to electron illumination crosses the electron beam at an angle of approximately 45°. In FIG. 2A, numeral 16 denotes a spring plate. The specimen 12 is energized toward a vertical plane of the holder 3 and thereby fixed to the holder 3. The holder 3 is rotatably attached to the outer frame 104 by a shaft 102. The axis of rotation of this shaft 102 crosses the electron beam and the shaft 102 is rotated in a direction indicated by an arrow A in FIG. 2B. In addition, the outer frame 104 is rotated in a direction of an arrow B by a rotating shaft (not illustrated) having an axis of rotation crossing the electron beam. As a result, the specimen 12 can be tilted in a double-tilt direction. The direction of rotation and the amount of rotation of each rotating shaft are arbitrarily controlled from the outside by the specimen tilting system 5.

Figure 3:
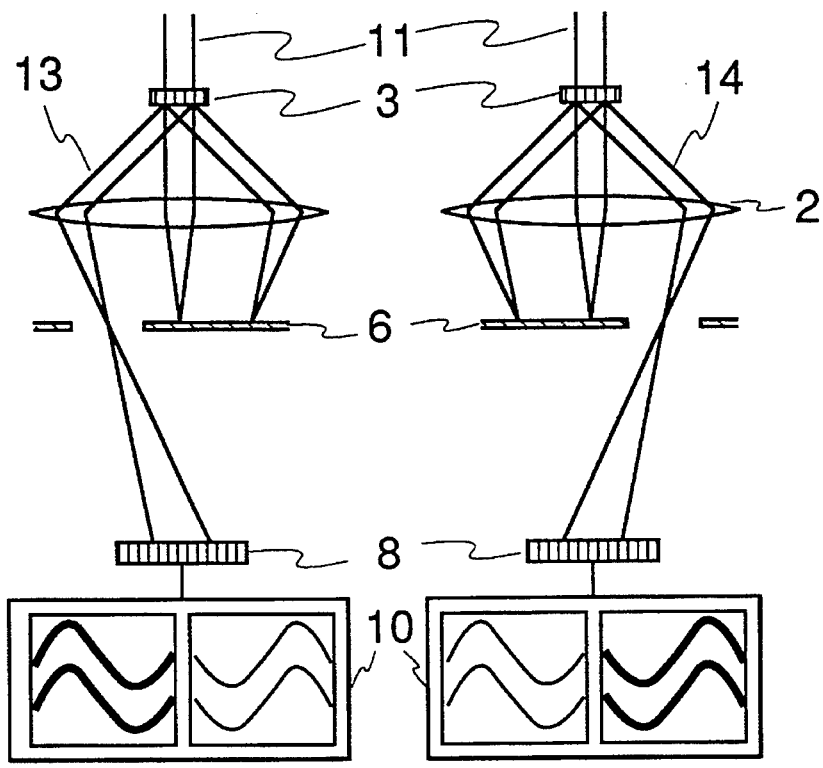
FIGS. 3A and 3B are diagrams showing a control system for simultaneously displaying a plurality of dark-field images having different plane indexes of the same specimen.

The objective aperture gonio stage system 7 includes an encoder, an actuator, and a step motor and allows position setting at a rate of at least ten places per second and at position precision of one μm or less. The objective aperture 6 is moved to a position of a diffracted wave and a transmitted wave having a desired plane index at high speed by the objective aperture gonio stage system 7. The objective aperture 6 projects dark-field images and bright-field images corresponding to respective plane indexes successively. In synchronism with the position of the objective aperture 6, the electron beam detector 8 outputs image signals. A plurality of dark-field images and bright-field images described above are transmitted to a display screen 10 without being overlapped each other. These positions of the objective aperture 6 and the display screen 10 are controlled by the processor 9. As shown in FIG. 3A, for example, an image signal of a 00n dark-field image obtained when the objective aperture is moved to the position of a (00n) diffracted wave 13 is displayed on the left display screen 10 until the next image signal of the 00n dark-field image arrives thereat. Then as shown in FIG. 3B, an image signal of a 00-n dark-field image obtained when the objective aperture 6 is moved to the position of a (00-n) diffracted wave is displayed on the right display screen 10 until the next image signal arrives thereat. By implementing the states of FIG. 3A and FIG. 3B alternately at intervals of a fixed time, the (00n) dark-field image and the (00-n) dark-field image fed from the same specimen are simultaneously displayed on the left and right display screens so that both dark-field images can be observed and compared with each other.

As the electron beam detector 9, a favorable light receiving element having at least 1000×1000 pixels, high sensitivity, and favorable linearity, such as a slow-scan CCD, is used. The display screen 10 has a plurality of display regions. Various observation images and analysis images can be displayed simultaneously on each display region. Furthermore, by using image processing software, an observation image and an analysis image can be displayed on the same display region so as to be overlapped each other.

An embodiment of a measuring method according to the present invention will now be described by taking a strained superlattice specimen of a compound semiconductor as an example.

First of all, a method for fabricating a specimen will be described. A specimen formed on a substrate is cleaved and cut out in a wedge form. In a GaAs crystal and an InP crystal typically used as the substrate, the surface is a (001) plane and (110), (1-10), (-110) and (-1-10) planes are easy cleavage planes. Since the surface and the cleavage planes are perpendicular to each other, a scratch mark is formed on the surface by using a scriber or the like and the surface is cleaved. Thereby a wedge-shaped specimen having a cross-sectional structure exposed on the cleavage plane is cut out. The angle of a wedge edge 20 shown in FIG. 2B and FIG. 5 is 90 degrees, and the cleavage plane becomes flat on the order of atoms. As a result, the specimen thickness linearly increases from the wedge edge 20.

Figure 4:
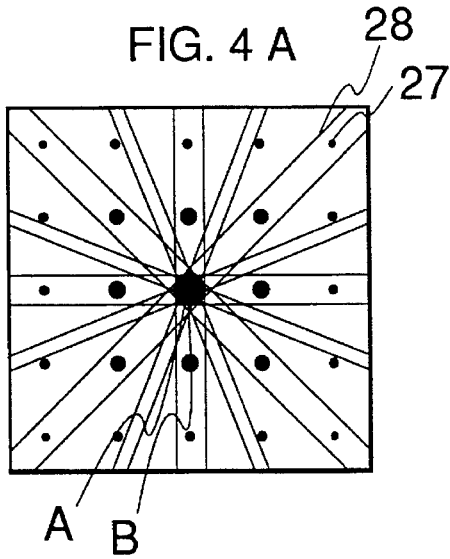
FIGS. 4A and 4B are diagrams showing the positional relation between a diffraction spot and a Kikuchi lines pattern.
Figure 4:
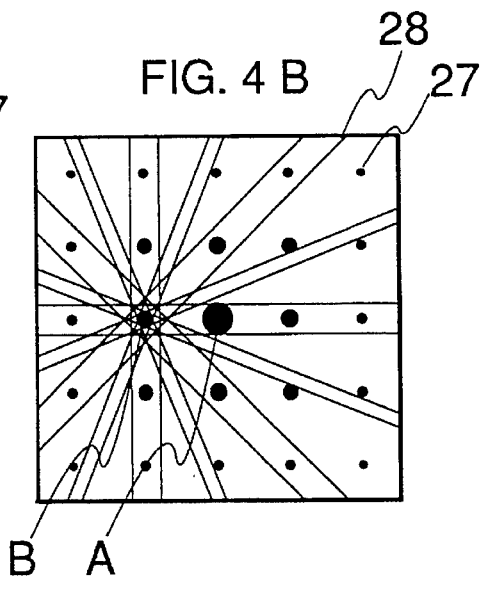

A method for impinging an incident electron beam 11 to the cross section of the above described specimen while controlling the incidence angle will now be described by referring to FIGS. 4A, 4B and 5. The wedge-shaped specimen 12 is fixed to a specimen fixing table 15 located on the specimen holder 3 capable of performing double tilt so that the cleavage plane may be oriented upward. The specimen thus fixed is inserted into the specimen chamber of the transmission electron microscope. The incidence direction of the electron beam, the crystalline growth direction, and the direction of increase of specimen thickness from the wedge edge are denoted by U, V and W, respectively. The electron beam 11 accelerated to several hundreds kV is impinged to a thin specimen portion located at the wedge edge at an angle of 45 degrees with respect to the above described cleavage plane, i.e., from the U direction. Since the cleavage plane has either of the above described four plane indexes, the electron beam 11 is incident from either of [100], [010], [0-10] and [-100] directions. Fine adjustment of the incidence angle of the electron beam 11 with respect to the specimen 12 is conducted by using the tilting system of the double tilt holder 3 while observing the diffraction pattern.

In case the specimen is thin, a diffraction spot 27 appears in the diffraction pattern. In case the specimen is thick, a Kikuchi lines pattern 28 appears in the diffraction pattern. While moving the incidence position of the electron beam in such a direction as to increase the thickness from the wedge edge, i.e., in the W direction, the diffraction pattern is observed and such a thickness position that the intensity of the diffraction spot 27 and the intensity of the Kikuchi lines pattern 28 appear at nearly the same degree is selected. When the incidence angle of the electron bean has changed under this state, the intensity of the diffraction spot 27 changes but the position does not change. On the other hand, the Kikuchi lines pattern 28 has such a character that its intensity does not change but its position changes. For example, if the incidence direction of the electron beam 11 is parallel to the lattice plane, the symmetry center A of the diffraction spot 27 coincides with the symmetry center B of the Kikuchi lines pattern 28 as shown in FIG. 4A. If the incidence direction of the electron beam 11 is not parallel to the lattice plane, however, the symmetry center A of the diffraction spot 27 deviates from the symmetry center B of the Kikuchi lines pattern 28 as shown in FIG. 4B. By utilizing this, the deviation of the incidence angle of the electron beam 11 with respect to the specimen 12 can be determined with precision of one to two mrad on the basis of the positional relation between the diffraction spot 27 and the Kikuchi lines pattern 28. By tilting the specimen 12 by using the double tilt holder 3, the deviation of the incidence angle is corrected and the electron beam is made parallel to the lattice plane. When there is no strain in the specimen, an analysis is made on bright-field images of the specimen thus tilted in accordance with the conventional method.

If an analysis software for judging the symmetry of figures is used, it is possible to automatically carry out the process of inputting a diffraction pattern to the processor, detecting the symmetry center A of the diffraction spot 27 and the symmetry center B of the Kikuchi lines pattern 28, and tilting the double tilt holder 3 so as to square the symmetry center A with the symmetry center B.

Under the specimen 12 tilted as described above, the objective aperture 6 is inserted so that only a desired transmitted wave or diffracted wave may pass through the aperture 6. Thereby, a transmitted image 19 of fifty thousand to sixty thousand magnifications is observed. As shown in FIG. 5, the cross-sectional structure of a strained superlattice specimen such as a heterointerface 22 is observed in the transmitted image 19. At the same time, an equal thickness fringe 23 appearing as a result of the electron diffraction effect is observed.

The occurrence mechanism of the equal thickness fringe 23 is explained as hereafter described by referring to the electron diffraction phenomenon. The intensity of the transmitted wave and diffracted wave passing through a crystal periodically fluctuates in the thickness direction (U direction) as a result of the multiple-scattering effect. Intensities of the transmitted wave and diffracted wave at the time when they are emitted from the bottom plane of the specimen are reflected in the transmitted image 19. In the wedge-shaped specimen 12 having thickness increased linearly, therefore, the intensity of transmitted electrons differs depending upon the thickness. It appears on the transmitted image 19 as periodic contrast of light and darkness in the W direction, i.e., the equal thickness fringe 23.

If two-wave approximation (supposing that there are only a transmitted wave and one strong diffracted wave as electron waves within the crystal) is used for brevity, the electron wave intensity within the crystal vibrates with a period called extinction distance D. The extinction distance D changes according to composition and diffraction condition. In case the crystal is $A_xB_{1-x}$ (x indicates composition), the extinction distance D can be represented by the following expression.

$$D \propto [\{Xf_A+(1-x)f_B\} \cdot W(\theta)]^{-1} \qquad \text{expression (1)}$$

where $f_A$ and $f_B$ are atomic scattering factors of atom A and atom B, W is a function representing the electron diffraction condition, and $\theta$ is the incidence angle of the electron beam 11 with respect to the crystal plane.

If the composition x changes, the structure factor of the crystal of the first term changes. If there is strain, then the lattice plane locally inclines in order to attain lattice match and the incidence angle $\theta$ of the electron beam 11 changes, and hence the electron diffraction condition of the second term changes. If the extinction distance D is changed by a composition change and a lattice plane inclination, then the distance from the specimen edge to the equal thickness fringe 23 on the transmitted image 19, for example such as a distance t from the specimen edge to the first line of the equal thickness fringe changes. In a region where the distance t of the equal thickness fringe 23 has changed, therefore, a composition change or a lattice plane inclination is judged to have occurred.

In the vicinity of a heterointerface, the composition changes. Furthermore, lattice planes of various plane indexes arranged in a 3-dimensional manner are inclined by strain. In the change of the distance t of the equal thickness fringe 23, information of the composition change and information of inclinations of lattice planes of various plane indexes are mixedly included. If these cannot be measured separately, the composition distribution in the vicinity of the heterointerface and the inclination angle distribution of each lattice plane cannot be analyzed.

In this embodiment, therefore, not only bright-field images but also dark-field images of various plane indexes are observed under various diffraction conditions. By thus analyzing the difference of the equal thickness fringe 23 on respective observation images, the specimen composition and strain are separated and analyzed quantitatively.

The electron beam incident on the crystal is diffracted by the lattice planes of various plane indexes to become a diffracted wave. The remaining part becomes a transmitted wave. The transmitted image formed by the (khl) diffracted wave which is diffracted by a certain khl lattice plane is referred to as khl dark-field image. The transmitted image formed by the transmitted wave is referred to as bright-field image. In the khl dark-field image, information of the khl lattice plane is reflected. On the other hand, the transmitted wave interacts with diffracted waves of all plane indexes. In the bright-field image, therefore, information of lattice planes of all plane indexes is reflected.

In the above described two conventional techniques, an analysis is made on the basis of only the equal thickness fringe on the bright-field image observed under a certain diffraction condition. Therefore, information of a lattice plane inclination of each plane index cannot be measured separately.

Figure 6:
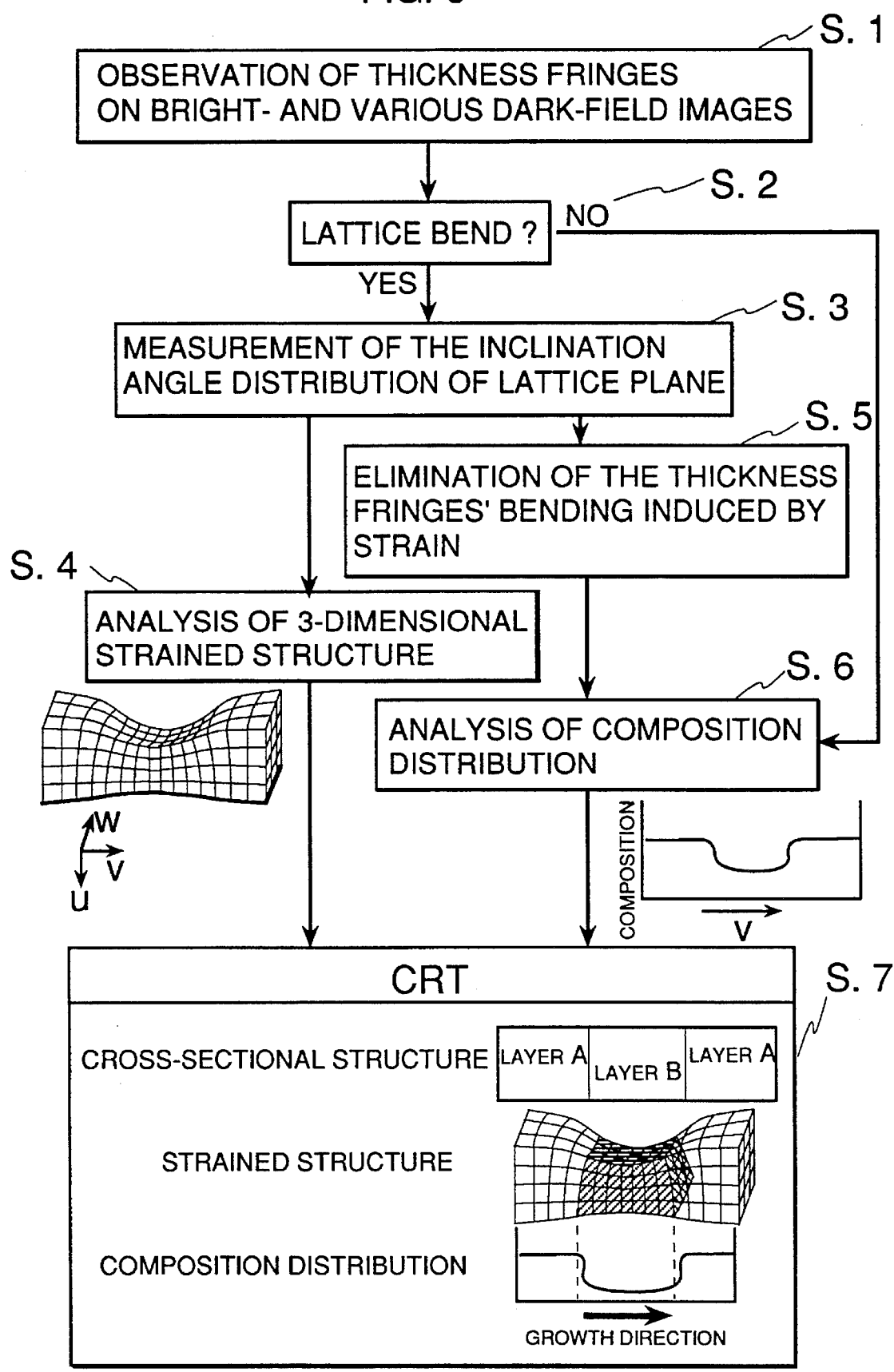
FIG. 6 is a flow chart showing an embodiment of an observation method according to the present invention.

In this embodiment, equal thickness fringes on the dark-field image and bright-field image of each plane index are observed and analyzed in accordance with a procedure shown in FIG. 6 by using the above described objective aperture gonio stage system 7, electron beam detector 8, processor 9 for control and image processing, and image display device 10.

First of all, a bright-field image and/or a dark-field image of a predetermined order is observed to detect the region where the position t of equal thickness fringe 23 thereof is changing (step 1).

Then at step 2, it is determined whether there is strain by comparing a dark-field image formed by a diffracted wave from the obverse of a lattice plane represented by a certain plane index with a dark-field image formed by a diffracted wave from the reverse, i.e., comparing dark-field images of opposite indexes.

If there is no strain, then processing proceeds to step 6 to make a composition distribution analysis according to the conventional technique.

If there is strain, then dark-field images of lattice planes represented by various plane indexes are observed and thereby the lattice plane inclination angle distribution of each plane index is separated and measured at step 3.

On the basis of obtained measurement results of inclination angle distribution of lattice planes having various plane indexes, a 3-dimensional strained structure analysis is made (step 4).

Furthermore, by using the inclination angle distribution of the lattice plane having each plane index, the equal thickness fringe with the influence of strain removed is reconstructed (step 5). On the basis of the equal thickness fringe thus reconstructed, composition distribution is analyzed in the same way as the conventional technique (step 6). Although the equal thickness fringe of the bright-field image is used in the conventional technique, composition distribution may also be analyzed by using the equal thickness fringe of the dark-field image in the same way.

At step 7, the cross-sectional structure of the crystal, the strained structure of the lattice, and composition distribution are simultaneously displayed on the CRT.

Aforementioned analysis of composition distribution is described in the aforementioned JP-A-62-26755, Kakibayashi et al., Japanese Journal of Applied Physics, Vol. 26, No. 5, May (1987), pp. 770–771 and Kakibayashi et al., Japanese Journal of Applied Physics, Vol. 25, No. 11, Nov. (1986), pp. 1644–1649. Aforementioned measurement of lattice plane inclination angle distribution is described in the aforementioned Kakibayashi et al., Japanese Journal of Applied Physics, Vol. 30, No. 1A, January (1991), pp. L52–L55. These four documents are incorporated herein by reference.

Hereafter, details of each process of observation and analysis will be described.

At step 1, a selection is made as to the dark-field image or bright-field image of which plane index is suitable for observation of composition and strain of the specimen. Because the change value of the distance t of the equal thickness fringe 23, i.e., the change value of intensity distribution, with respect to a composition change or a lattice plane inclination differs depending upon the crystal structure of a specimen. The analysis of composition distribution is made on a dark-field image or a bright-field image of a plane index which maximizes the change value of the distance t of the equal thickness fringe 23 for a composition change. On the other hand, the change value of the distance t of the equal thickness fringe 23 for a lattice plane inclination becomes larger as the order of the plane index of the dark-field image becomes higher. Since the electron beam intensity of a diffracted wave of high order is weak, however, the contrast of the equal thickness fringe 23 is small and the image becomes unclear. The plane index of the dark-field image used for analysis of the lattice plane inclination value is determined in due consideration of the above described condition. It is efficient to use calculation based upon the theory of electron diffraction in the above described selection process. In a case where an $Al_xGa_{1-x}As$ crystal is observed by an electron beam with [100] incident angle, it is desired that the plane index is (020) or (002).

A method for determining whether the lattice plane of a certain plane index is inclined by strain will now be described (step 2). First of all, the lattice plane inclination and a change of the distance t of the equal thickness fringe 23 on the dark-field image will now be described by referring to FIGS. 7A and 7B. It should be noted that the inclination angle distribution of the lattice plane depends on distance between the heterointerface and the lattice plane, i.e. the inclination angle distribution is considered varied in the V direction while constant in the W and U directions. Accordingly, sectional views which show the inclination angle distribution of the lattice plane are employed in FIGS. 7A and 7B. It is supposed that a specimen to be observed has a (00n) lattice plane 24 inclined symmetrically at a strained region by the lattice strain. When the electron beam 11 is impinged upon the specimen, the electron beam 11 is the diffracted simultaneously by the observe and reserve of the (00n) lattice plane 24, resulting in (00n) diffracted wave 13 and (00-n) diffracted wave 14, respectively. The remaining part becomes a transmitted wave. FIGS. 7A and 7B are diagrams showing the difference between the case where a specimen is observed on the 00n dark-field image 19 formed by the (00n) diffracted wave 13 and the case where the same specimen is observed on the 00n dark-field image 19 formed by the (00-n) diffracted wave 14.

Referring to FIG. 7A, a change of the distance t of the equal thickness fringe 23 on the 00n dark-field image 19 formed by the (00n) diffracted wave 13 will first be described. Bragg diffraction conditions of the 00n diffracted wave respectively in the left strained region, unstrained regions located at both ends and the central part of the crystal, and the right strained region becomes as described below. The deviation value of the 00n diffracted wave from the Bragg diffraction condition is represented by the deviation angle of the lattice plane from the Bragg angle of the 00n diffracted wave. The deviation angle in the left strained region is $\theta_1$ ($\theta_1=0$). In the unstrained region, the deviation angle becomes $\theta_2$ ($|\theta_2|>|\theta_1|$). In the right strained region, the deviation angle becomes $\theta_3$ ($|\theta_3|>|\theta_2|$). As the deviation angle approaches 0, the electron diffraction condition W of the expression (1) becomes small and the extinction distance D becomes large, and hence the distance t of the equal thickness fringe 23 becomes long. At the deviation angle $\theta_1=0$ in the left strained region, the distance of the equal thickness fringe becomes $t_1$ which is the longest. At the deviation angle $\theta_2$ in the unstrained region, the distance of the unstrained region becomes $t_2$ which is shorter than $t_1$. At the deviation angle $\theta_3$ in the right strained region, the distance of the equal thickness fringe becomes $t_3$ which is shorter than $t_2$.

Referring to FIG. 7B, the change of the position t of the equal thickness fringe 23 of the 00-n dark-field image 19 formed by the diffracted wave (00-n diffracted wave 14) fed from a (00-n) lattice plane, which is the reserve of the (00n) lattice plane will now be described. The Bragg diffraction condition of the 00-n diffracted wave, i.e., the deviation angle of the lattice plane from the Bragg angle of the 00-n diffracted wave becomes as described below. Since the deviation angle in the right strained region is $\theta_1=0$, the distance of the equal thickness becomes $t_1$. Since the deviation angle in the unstrained region is $\theta_2$, the distance of the equal thickness fringe becomes $t_2$. Since the deviation angle in the left strained region is $\theta_3$, the distance of the equal thickness fringe becomes $t_3$. Therefore, the shape of the equal thickness fringe 23 on the 00n dark-field image 19 is exactly reversed.

The difference of the distance t of the equal thickness fringe 23 on the 00±n dark-field image 19 will now be described. The difference of the distance t of the equal thickness fringe 23 is the difference of the extinction distance. Principal factors determining the extinction distance are the structure factor and the electron diffraction condition of the crystal. Structure factors of the crystal of the 00n diffracted waves 13 and 14 passed through the same region are equal. Since the Bragg angle differs in the 00±n diffracted waves 13 and 14, however, a difference is caused in the electron diffraction condition. In the left strained region, the deviation angle of the 00n diffracted wave 13 from the Bragg angle is $\theta_1=0$. Therefore, the distance of the equal thickness fringe 23 on the 00n dark-field image becomes as long as $t_1$. However, the deviation angle of the 00-n diffracted wave 14 from the Bragg angle becomes $\theta_3$. Therefore, the distance of the equal thickness fringe 23 on the 00-n dark-field image becomes as short as $t_3$. On the other hand, in a region where the (00n) lattice plane 24 is parallel to the incident electron beam 11, deviation angles of the 00±n diffracted waves 13 and 14 from the Bragg angle are both $\theta_2$, and distances of equal thickness fringes 23 are both $t_2$.

That is to say, if the distances t of the equal thickness fringes 23 on the 00±n dark field images 19 are equal, the (00n) lattice plane 24 is judged to be parallel to the incident electron beam 11. If the distances are different, the (00n) lattice plane 24 is judged to be inclined.

The inclination direction of the (00n) lattice plane 24 is such a direction as to satisfy the Bragg condition of the diffracted wave of a plane index for which the distance t of the equal thickness fringe 23 becomes long. By utilizing the above described difference between distances t of equal thickness fringes 23 on dark-field images of opposite indexes, the lattice plane inclination direction can be discriminated even in a region where a lattice plane inclination and a composition change are simultaneously caused by strain.

A method for quantitatively measuring the lattice plane inclination angle distribution will now be described (step 3). On the basis of the change of the distance t of the equal thickness fringe 23 obtained when the wedge-shaped specimen 12 is observed at various inclination angles, the lattice plane inclination angle distribution is measured. As the method for measuring the lattice plane inclination angle distribution, two methods are conceivable.

Figure 8:
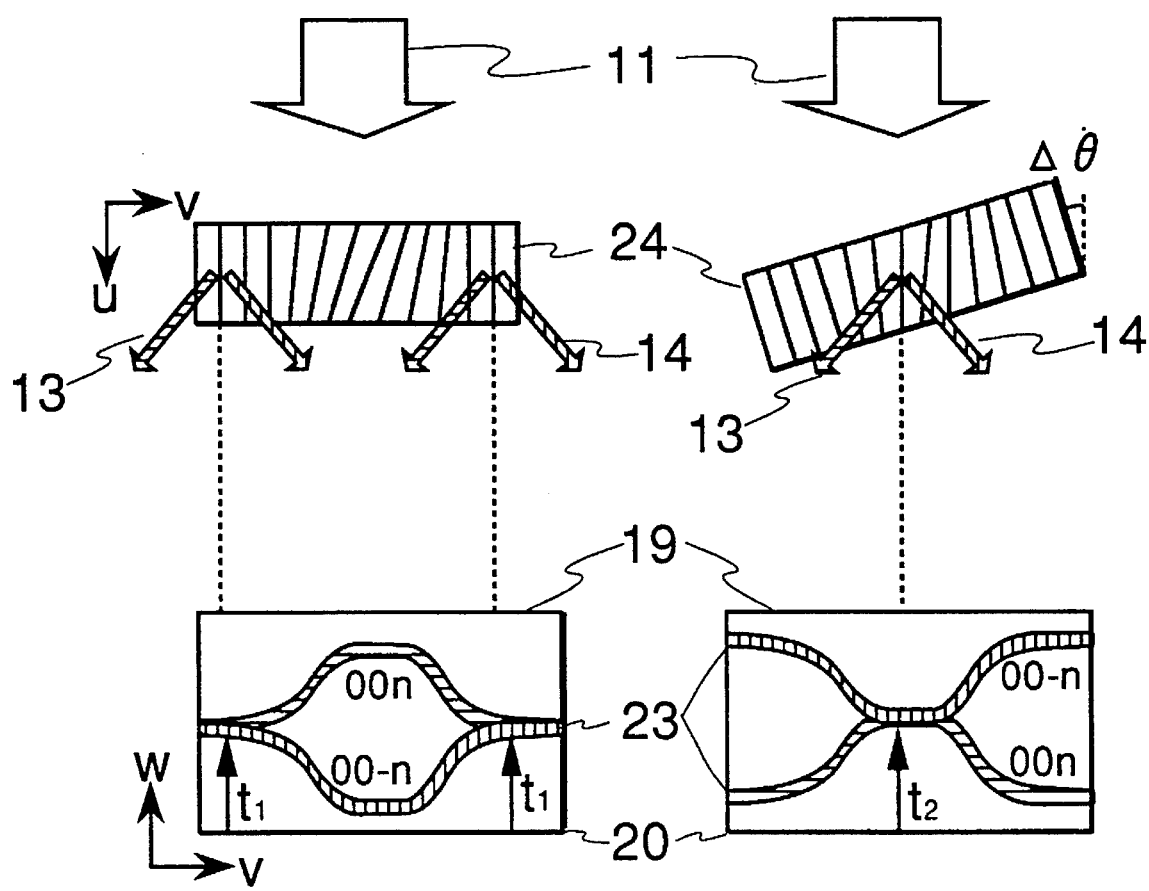
FIGS. 8A and 8B are diagrams showing the change of distance of equal thickness fringe on dark-field images of opposite signs when the specimen is tilted.

According to one of the two methods, the above described difference between distances t of equal thickness fringes 23 on dark-field images 19 having opposite indexes are used. The change of the distance t of the equal thickness fringe 23 on the 00±n dark-field images 19 formed by the 00±n diffracted waves 13 and 14 in case where the lattice plane 24 of the central part is inclined as shown in FIG. 8B will now be described.

In case the specimen 12 is not inclined (FIG. 8A), lattice planes 24 located at both ends of the specimen 12 are parallel to the incident electron beam 11. At both ends of the specimen 12, therefore, distances of the equal thickness fringes 23 of the 00±n dark-field images coincide and have a certain value of $t_1$. If the specimen 12 is inclined as shown in FIG. 8B, the position where the lattice plane 24 becomes parallel to the incident electron beam 11 moves to the central part of the specimen 12. In the central part of the specimen, therefore, distances of equal thickness fringes 23 on the 00±n dark-field images 19 coincide and have a certain value of $t_2$. In case composition at both ends of the specimen 12 differs from that in the central part thereof, $t_1$ is different from $t_2$. However, there is no change in such a phenomenon that distances t of equal thickness fringes on the 00±n dark-field images 19 coincide if the lattice plane 24 becomes parallel to the incident electron beam 11. The difference in lattice plane inclination angle between the central part of the specimen 12 and both ends thereof is equal to the difference $\Delta\theta$ in inclination angle of the specimen 12 between FIG. 8A and FIG. 8B.

Figure 9:
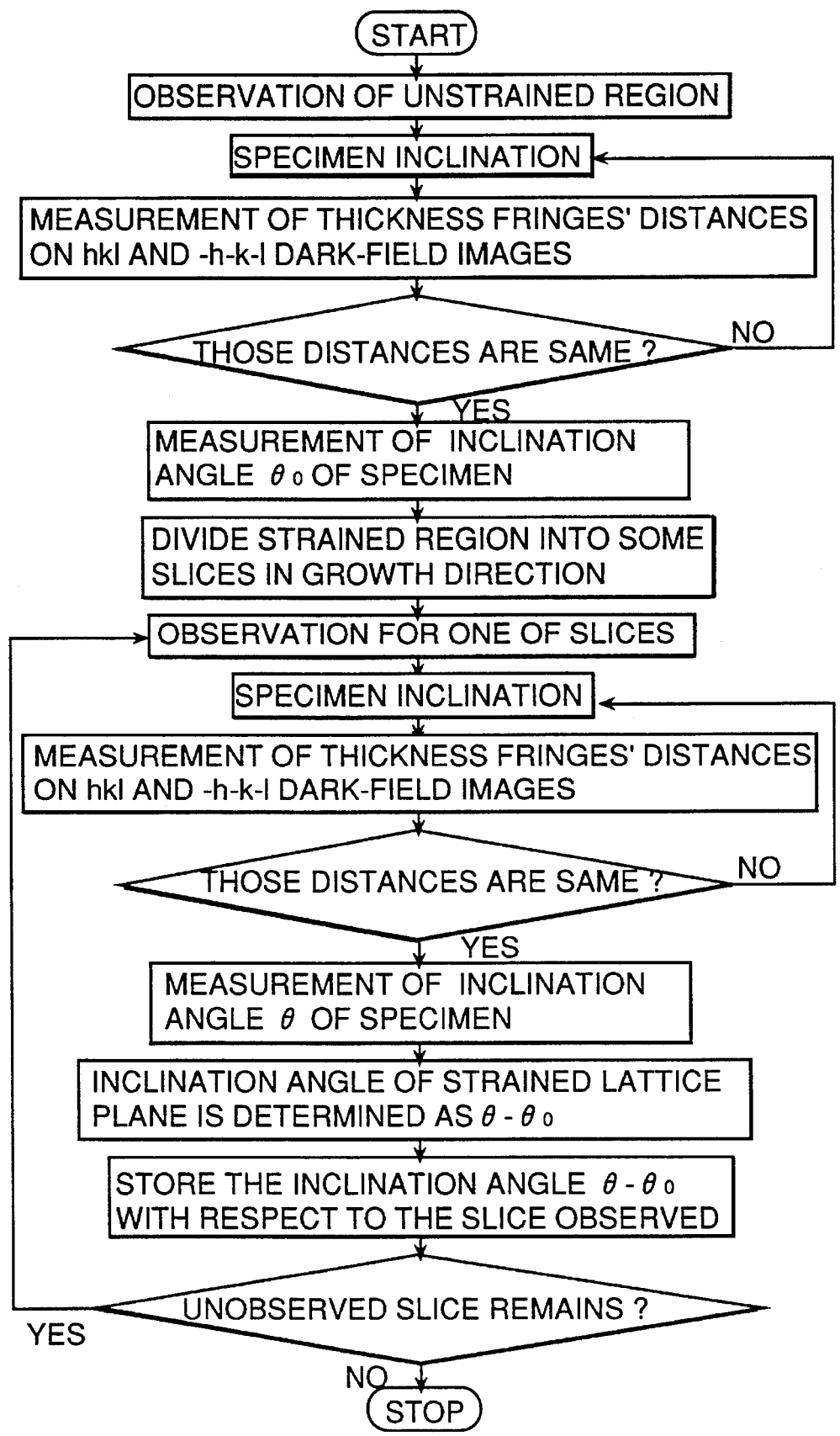
FIG. 9 is a flow chart for measuring the inclination angle distribution of the lattice plane by using the difference between equal thickness fringes on dark-field images of opposite signs.

By utilizing the above described principle, the lattice plane inclination angle distribution is measured in accordance with the procedure shown in FIG. 9. That is to say, while inclining the specimen 12, a specimen inclination angle $\theta$ whereat distances t of equal thickness fringes 23 on the ±00n dark-field images 19 coincide is detected for each region. Letting the specimen inclination angle in an unstrained region sufficiently separated from the heterointerface be $\theta_0$, the lattice plane inclination angle in a strained region becomes $\theta-\theta_0$.

Figure 10:
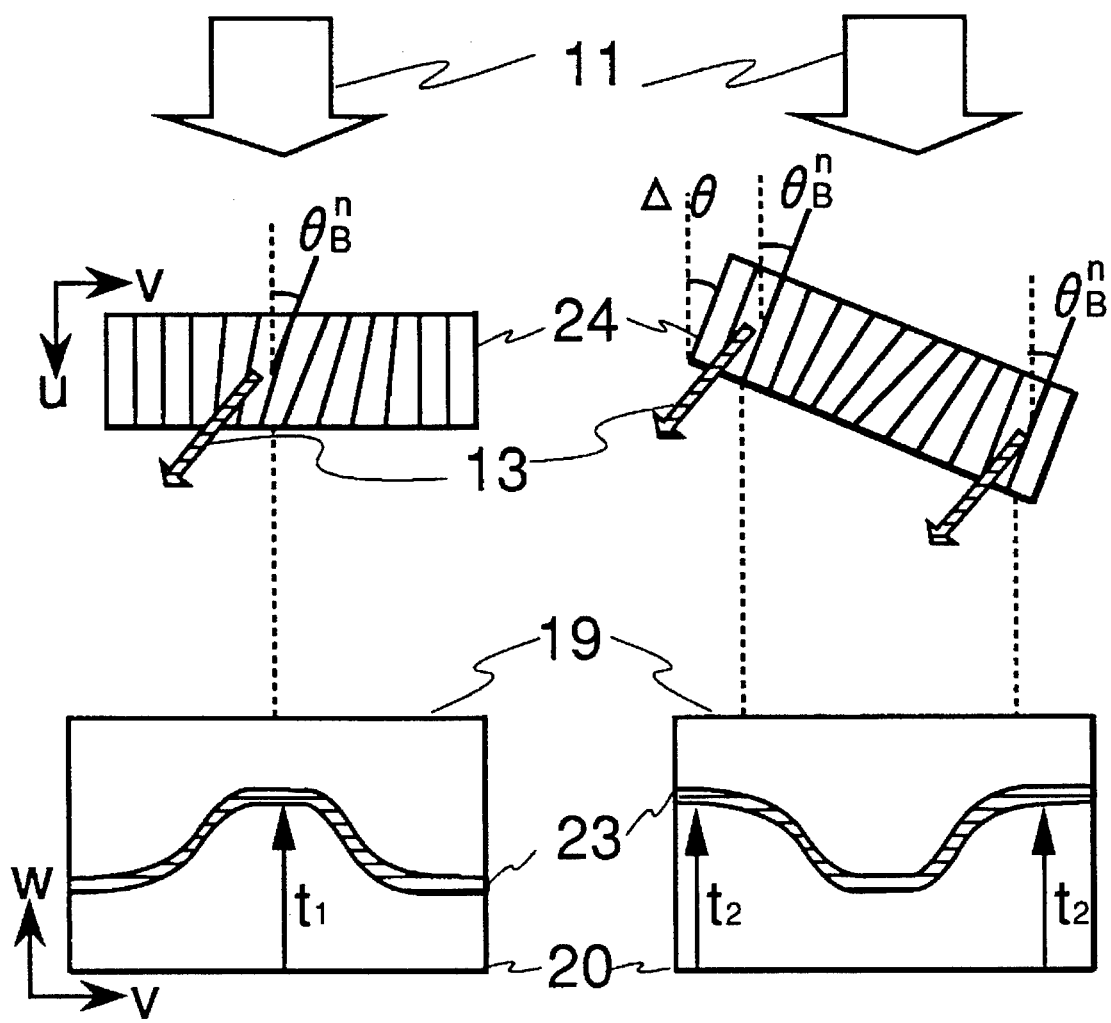
FIGS. 10A and 10B are diagrams showing the change of distance of equal thickness fringe on the dark-field image when the specimen is tilted.

The other of the two lattice plane inclination angle measuring methods utilizes such a phenomenon that the distance t of the equal thickness fringe 23 becomes the longest when the deviation angle of the lattice plane 24 from the Bragg angle is zero. It is now assumed that the 00n diffracted wave 13 is emitted from the specimen 12 having an inclined lattice plane 24 of the central part as shown in FIGS. 10A and 10B. The change of the distance t of the equal thickness fringe 23 on the 00n dark-field image 19 formed by such a 00n diffracted wave will now be described.

In case the specimen 12 is not inclined (FIG. 10A), the deviation angle of the lattice plane 24 of the central part from the Bragg angle becomes zero. Among various inclinations of the specimen 12, therefore, the distance of the equal thickness fringe 23 of the central part of the specimen 12 becomes the longest value $t_1$ when the specimen 12 is in the state shown in FIG. 10A. Assuming now that the specimen 12 is inclined as shown in FIG. 10B, regions where the above described deviation angle becomes zero are located at both ends. Therefore, the regions where the distance t of the equal thickness fringe 23 becomes the longest are located at both ends, and the distance t becomes a certain value $t_2$. In this case as well, $t_1$ is different from $t_2$ if both ends of the specimen 12 differ from the central part thereof in composition. However, there is no change in such a phenomenon that the distance t of the equal thickness fringe becomes the longest when the deviation angle is zero. The difference in lattice plane inclination angle between the central part of the specimen 12 and both ends thereof is equal to the difference $\Delta\theta$ in inclination angle of the specimen 12 between FIG. 10A and FIG. 10B.

Figure 11:
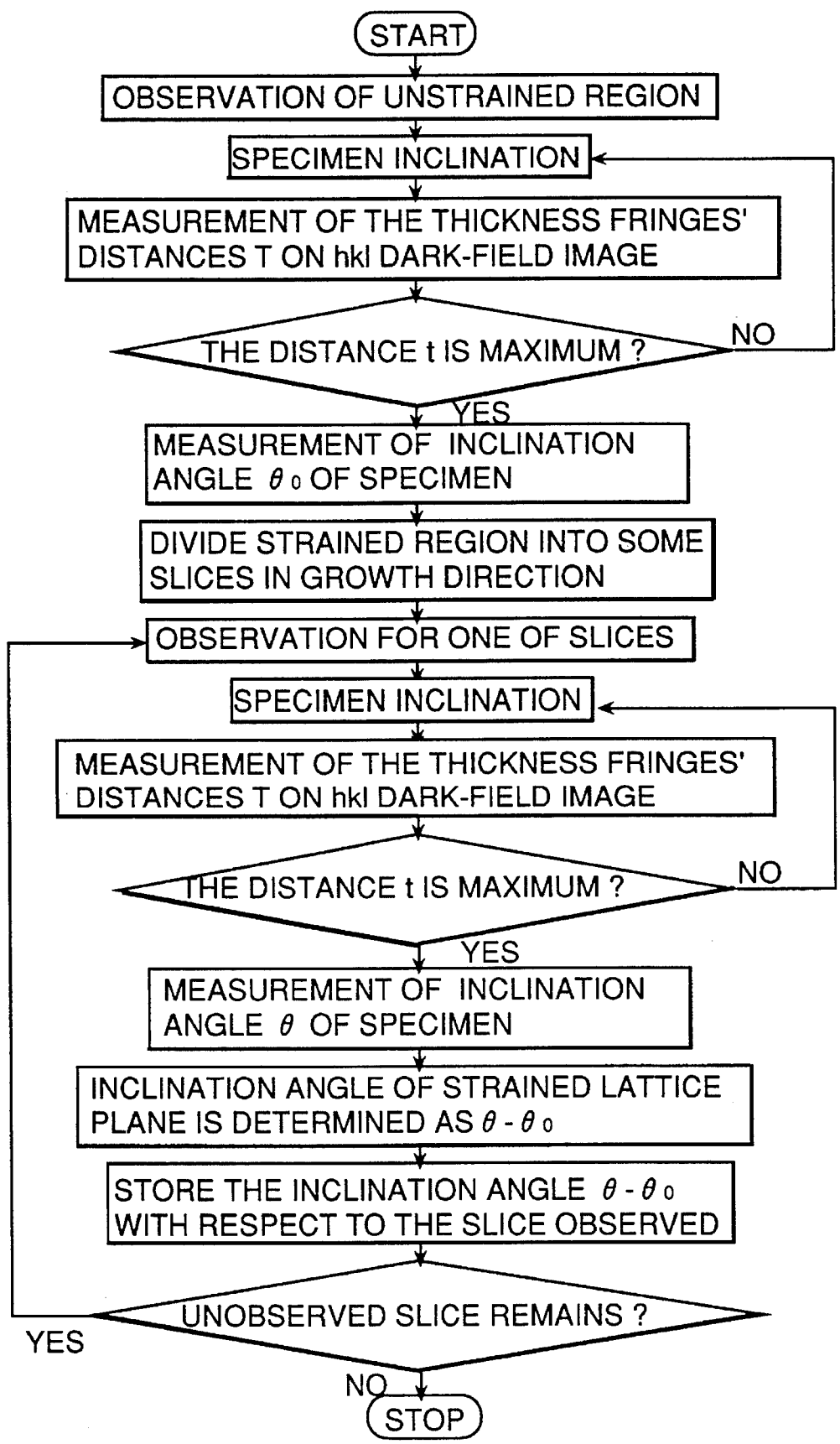
FIG. 11 is a flow chart for measuring the inclination angle distribution of the lattice plane by using the equal thickness fringe on the dark-field image.

By utilizing the above described principle, the lattice plane inclination angle distribution is measured in accordance with the procedure shown in FIG. 11. That is to say, while tilting the specimen 12, a specimen inclination angle θ whereat the distance t of the equal thickness fringe 23 becomes the longest is detected. Letting the specimen inclination angle in an unstrained region sufficiently separated from the heterointerface be $\theta_0$, the lattice plane inclination angle in a strained region becomes $\theta-\theta_0$.

Figure 12:
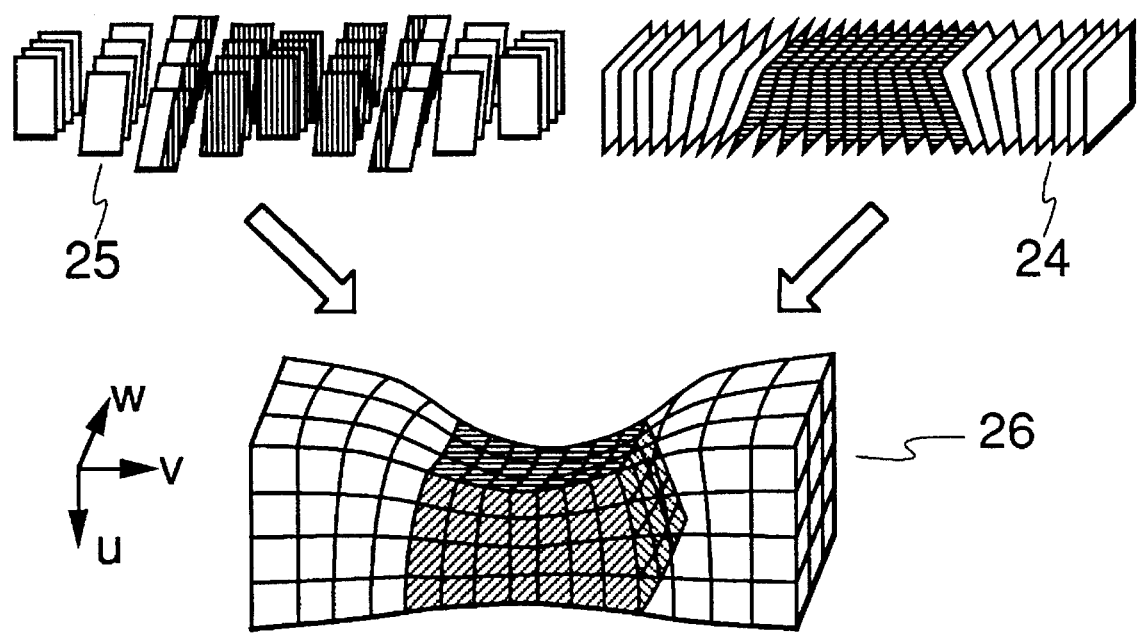
FIG. 12 is a diagram showing a 3-dimensional lattice model including a strained structure.

Then, an analysis of the 3-dimensional strained structure is made (step 4). If one of the above described lattice plane inclination angle measuring method is used, the lattice plane inclination angle distribution of a plane index to be analyzed can be measured individually even in a region having a mixture of a composition change and lattice plane inclinations of various plane indexes. On the basis of results of the measurement, a 3-dimensional strained structure is constructed. For example, lattice plane inclination angle distribution of the above described (00n) lattice plane 24 and a (0n0) lattice plane 25 perpendicular thereto as shown in FIG. 12 is measured. If measurements show that (00n) lattice planes 24 incline in opposite directions in left and right strained regions and (0n0) lattice planes 25 incline in the same direction as shown in FIG. 12, a 3-dimensional strained structure 26 as shown in FIG. 12 can be constructed by combining results of these measurement and analysis. Furthermore, by analyzing lattice planes of various plane indexes, a more detailed 3-dimensional strained structure analysis can be made.

A method for removing the influence of strain from the observed equal thickness fringe 23 (step 5) and for reconstructing the equal thickness fringe 23 with only the influence of the composition change reflected (step 6) in order to analyze the composition distribution will now be described by referring to FIG. 13.

According to the conventional method, information of the composition change and information according to strain are contained in the observed equal thickness fringe (FIG. 13A). In this embodiment, a strained region of the specimen is first divided into some slices or some segments in the growth direction (V direction) in the same way as FIG. 9 or FIG. 11 (step 100 of FIG. 13B). The inclination angle of the lattice plane in each slice has already been preserved.

Then, an electron beam is impinged while changing the inclination angle of the specimen, i.e., changing the incidence angle. In the equal thickness fringe of the bright-field image obtained at that time, intensity distribution of a portion corresponding to a slice having a lattice plane substantially parallel to the electron beam is related to the slice and preserved. For example, when the specimen is not tilted at all, it is considered that slices on both sides of the specimen are upright and its crystalline lattice planes are parallel to the electron beam. As shown in step 100, therefore, intensity distributions of equal thickness fringes of portions corresponding to slices of both sides are preserved. In the same way, intensity distribution of the equal thickness fringe corresponding to such a state that the lattice plane of the crystal is parallel to the electron beam is preserved for every slice (step 101). The preserved intensity distributions are combined (step 102). A resultant equal thickness fringe 123 does not contain the influence of strain. That is to say, the change of the distance t of the equal thickness fringe 123 reflects only the composition change.

Finally, a quantitative analysis of composition distribution is made. First of all, simulation using the theory of electron diffraction is performed and relations of correspondence between the composition change value and the change value of the distance t of the equal thickness fringe 123 are derived beforehand. If the result of this simulation is used, distribution of composition in the growth direction (V direction) is analyzed on the basis of the change value of the distance t of the reconstructed equal thickness fringe 123.

The intensity distribution of the equal thickness fringe contains the influence of lattice strain relaxation in the vicinity of the specimen surface. This influence differs depending upon the crystalline structure of the specimen as well. In a specimen having significant strain relaxation in the vicinity of the surface, it is necessary to assume a strain model with due regard to strain relaxation in the vicinity of the surface, perform simulation, and correct the measured lattice plane inclination angle of each plane index. By this correction, the strained structure of the specimen bulk portion can be analyzed accurately.

According to the present embodiment, the composition distribution and strained structure can be analyzed with a spatial resolution (approximately 0.5 nm) of an electron microscope. Therefore, it is possible to display the cross-sectional structure of the specimen and results of analysis of composition distribution and strained structure simultaneously on the display screen 10 and evaluate them in association with the cross-sectional structure.

According to the present embodiment, the composition distribution and strained structure corresponding to the cross-sectional structure of a device can be quantitatively analyzed with a spatial resolution of approximately 0.5 nm, on the basis of the equal thickness fringe of a wedge-shaped specimen appearing on a transmission electron microscope. If a composition change and a lattice plane inclination caused by strain occur in the same region, analysis of the composition distribution and strain distribution in that region becomes impossible when the conventional method is used. In the present embodiment, however, the lattice plane inclination value of each plane index can be individually estimated, and hence a 3-dimensional strained structure analysis, reconstruction of the equal thickness fringe with the influence of strain removed, and a quantitative analysis of composition distribution using the reconstructed equal thickness fringe can be made. Therefore, various strained superlattices which have heretofore been impossible to analyze can be analyzed.

While the present invention has been described in detail, it should be understood that various changes, substitutions and alterations can be made hereto without departing from the spirit and scope of the present invention as defined by the appended claims.

We claim:

1. An electron microscope for composition and strain analysis, comprising:

a specimen holder for holding a wedge-shaped specimen;

means for impinging an electron beam upon a cleavage plane of said specimen and transmitting said electron beam through said specimen;

means for deriving a dark-field image of said specimen, said dark-field image including a first equal thickness fringe;

means for detecting a change of intensity distribution of said first equal thickness fringe of said dark-field image while changing an angle of said cleavage plane of said specimen with respect to the electron beam impinged;

means for analyzing an angle distribution of a crystal lattice plane of said specimen, on the basis of the detected change of said intensity distribution;

means for deriving a strained structure from said angle distribution;

means for referring to said angle distribution, controlling the angle of said specimen so as to impinge said electron beam upon said specimen at a predetermined angle with respect to the crystal lattice plane of said specimen, and deriving a bright-field image or a second dark-field image of said specimen by using the specimen thus controlled, said bright-field image or second dark-field image including a second equal thickness fringe;

means for analyzing composition of said specimen on the basis of said second equal thickness fringe; and means for displaying the analyzed strained structure and composition of said specimen.

2. An electron microscope according to claim 1, wherein said specimen holder includes means for fixing said specimen so that said cleavage plane forms an angle of nearly 45 degrees with said electron beam.

3. An electron microscope according to claim 1, wherein said specimen holder includes means for tilting said specimen in a double tilt direction with respect to said electron beam, and the incidence angle of said electron beam is changed by inclination of said specimen.

4. An electron microscope according to claim 1, wherein said display device simultaneously displays said first dark-field image and bright-field image or said second dark-field image.

5. An electron microscope according to claim 1, wherein said detecting means comprises an electron beam detector having at least 1000×1000 pixels, high sensitivity, and favorable linearity.

6. An electron microscope according to claim 1, wherein said display device displays distribution of said strained structure and distribution of crystal composition of a specimen so as to correspond to a cross-sectional structure of the specimen provided beforehand.

7. An electron microscope for composition and strain analysis, comprising:

a specimen holder for holding a wedge-shaped specimen;

means for impinging an electron beam upon a cleavage plane of said specimen and transmitting said electron beam through said specimen;

means for deriving a first dark-field image of said specimen formed by diffraction of said transmitted electron beam in a crystal lattice plane represented by a first plane index, said first dark-field image including a first equal thickness fringe;

means for deriving a second dark-field image of said specimen formed by diffraction of said transmitted electron beam in a crystal lattice plane represented by a second plane index, said second dark-field image including a second equal thickness fringe;

means for detecting changes of said first and second equal thickness fringes while changing an angle of said cleavage plane of said specimen with respect to the electron beam impinged;

means for analyzing an angle distribution of a crystal lattice plane of said specimen, on the basis of the detected changes of said first and second equal thickness fringes;

means for referring to the analyzed angle distribution, controlling the angle of said specimen so as to impinge said electron beam upon said specimen in parallel to the crystal lattice plane of said specimen, and deriving a bright-field image or a third dark-field image of said specimen by using the specimen thus controlled, said bright-field image or third dark-field image including a third equal thickness fringe;

means for analyzing composition of said specimen on the basis of said third equal thickness fringe; and means for displaying the analyzed angle distribution and composition of said specimen.

8. An electron microscope for composition and strain analysis, comprising:

a specimen holder for holding a wedge-shaped specimen;

means for impinging an electron beam upon a cleavage plane of said specimen and transmitting said electron beam through said specimen;

means for controlling an angle of said cleavage plane of said specimen with respect to said electron beam impinged;

means for searching a first angle of said specimen with respect to said electron beam, said first angle searching means including:
(a) means for moving the cleavage plane of said specimen in such a direction as to change thickness of said specimen while keeping an angle of said cleaved plane with respect to said electron beam at a constant value, and for searching such a position that a diffraction spot and a Kikuchi lines pattern thus derived are observed with substantially the same intensity; and
(b) means for changing angle of said cleaved plane with respect to said electron beam in said searched position and for searching the first angle at the time when a symmetry center of said diffraction spot substantially coincides with a symmetry center of said Kikuchi lines pattern;

means for impinging said electron beam upon a desired position of the cleavage plane of said specimen at said searched first angle, deriving first and second dark-field images represented by plane indexes having signs opposite to each other, and determining whether a first lattice plane on the desired position in said specimen is bended on the basis of a first equal thickness fringe of said first dark-field image and a second equal thickness fringe of said second dark-field image, said determining means judging said first lattice plane is bended when said first equal thickness fringe differs from said second equal thickness fringe and judging said first lattice plane is not bended when said first equal thickness fringe is substantially equal to said second equal thickness fringe;

means for detecting a change of a third equal thickness fringe of a third dark-field image in said desired position while changing the angle of the cleaved plane, when said determining means has judged said first lattice plane is bended;

means for analyzing an angle distribution of a crystal lattice plane of said specimen, on the basis of the detected change of said third equal thickness fringe;

means for referring to the analyzed angle distribution, controlling the angle of said cleaved plane so as to impinge said electron beam upon said specimen at a predetermined angle with respect to the crystal lattice plane of said specimen, and deriving a first bright-field image or a fourth dark-field image of said specimen by using the specimen thus controlled, said first bright-field image or fourth dark-field image including a fourth equal thickness fringe;

means for impinging said electron beam upon said specimen in said desired position at said searched first angle when said determining means has judged said first lattice plane is not bended and for deriving a second bright-field image or a fifth dark-field image, said second bright-field image or fifth dark-field image including a fifth equal thickness fringe;

means for analyzing composition of said specimen on the basis of said fourth or fifth equal thickness fringe; and means for displaying the analyzed angle distribution and composition of said specimen.

9. An apparatus for composition and strain analysis, comprising:

a specimen holder for holding a wedge-shaped specimen;

means for impinging a charged particle beam upon a cleavage plane of said specimen and transmitting said charged particle beam through said specimen;

means for deriving a first dark-field image of said specimen formed by diffraction of said transmitted charged particle beam in a crystal lattice plane represented by a first plane index, said first dark-field image including a first equal thickness fringe;

means for deriving a second dark-field image of said specimen formed by diffraction of said transmitted charged particle beam in a crystal lattice plane represented by a second plane index, said second dark-field image including a second equal thickness fringe;

means for detecting changes of said first and second equal thickness fringes while changing an angle of said cleavage plane of said specimen with respect to said charged particle beam impinged;

means for analyzing angle distribution of a crystal lattice plane of said specimen, on the basis of the detected changes of said first and second equal thickness fringes;

means for deriving a strained structure from said angle distribution;

means for referring to said angle distribution of the lattice plane, controlling the angle of said specimen so as to impinge said charged particle beam upon said specimen at a predetermined angle with respect to said crystal lattice plane, and deriving a bright-field image or a third dark-field image of said specimen by using the specimen thus controlled, said bright-field image or said third dark-field image including a third equal thickness fringe;

means for analyzing composition of said specimen on the basis of said third equal thickness fringe; and means for displaying at least one of the strained structure and composition of said specimen.

10. An electron microscope for composition and strain analysis, comprising: means for impinging an electron beam upon a cleavage plane of a wedge-shaped specimen in parallel to a crystal lattice plane thereof;

means for controlling an angle of the cleavage plane of said specimen with respect to said electron beam impinged;

means for moving said cleavage plane of said specimen in such a direction as to change thickness of said specimen while keeping an angle of said cleaved plane with respect to said electron beam at a constant value, and for stopping scanning in such a position that a diffraction spot and a Kikuchi lines pattern thus derived are observed with substantially the same intensity; and means for changing angle of said cleaved plane with respect to said electron beam in said position and for making a symmetry center of said diffraction spot substantially coincide with a symmetry center of said Kikuchi lines pattern, the electron beam being substantially parallel to said crystal lattice plane at that time.

11. A method for observing composition and strain of a specimen, comprising the steps of:

processing said specimen into a wedge shape by cleaving;

impinging an electron beam upon a cleavage plane of said specimen and transmitting said electron beam through said specimen;

observing a first dark-field image of said specimen by using said transmitted electron beam, said first dark-field image including a first equal thickness fringe;

detecting a change of said first equal thickness fringe while changing an angle of said cleavage plane of said specimen with respect to said electron beam impinged;

analyzing an angle distribution of a crystal lattice plane of said specimen, on the basis of the detected change of said first equal thickness fringe;

deriving a strained structure from said angle distribution;

referring to said angle distribution, controlling the angle of said specimen so as to impinge said electron beam upon said specimen at a predetermined angle with respect to the crystal lattice plane of said specimen, and deriving a second equal thickness fringe of a bright-field image or a second dark-field image of said specimen by using the specimen thus controlled;

analyzing composition of said specimen on the basis of said second equal thickness fringe; and displaying said strained structure and composition of said specimen.

12. An observation method according to claim 11, wherein said first dark-field image is formed by using a diffracted wave of high order.

13. An observation method according to claim 11, wherein the cleavage plane of said specimen is selected so as to maximize the change of intensity distribution of said second equal thickness fringe with respect to a crystal composition change when said electron beam is impinged upon the cleavage plane.

14. An observation method according to claim 11, wherein said step of analyzing the angle distribution of the crystal lattice plane comprises the step of analyzing the angle distribution of said crystal lattice plane on the basis of inclination angles of said specimen at the time when maximum values of said first equal thickness fringe according to the Bragg diffraction condition are derived.

15. An observation method according to claim 11, further comprising the steps of:

observing a dark-field image of a crystal lattice plane represented by a plane index having a sign opposite to a plane index of the crystal lattice plane diffracting said first dark-field image, said observed dark-field image including a third equal thickness fringe; and said step of analyzing the angle distribution of the crystal lattice plane comprises the step of analyzing the angle distribution of said crystal lattice plane on the basis of an inclination angle of said specimen at the time when intensity of said first equal thickness fringe becomes substantially equal to intensity of said third equal thickness fringe.

16. An observation method according to claim 11, wherein said step of deriving the second equal thickness fringe comprises the steps of:

referring to the angle distribution of said crystal lattice plane, and selecting intensity distribution of a portion of an equal thickness fringe derived by setting said specimen at a certain angle with respect to said electron beam corresponding to a portion of said specimen in which the incidence angle of said electron beam becomes substantially parallel to the crystal lattice plane of said specimen, and preserving the selected portion of said derived equal thickness fringe;

changing the angle of said specimen and repeating said preserving step; and combining preserved equal thickness fringes and forming said second equal thickness fringe, influence of said lattice strain being removed in said second equal thickness fringe.

17. An observation method according to claim 11, wherein said strained structure deriving step comprises the steps of:

assuming a 3-dimensional lattice model having a plurality of segments;

applying said analyzed angle distribution to each segment of said lattice model and making a calculation of the shape of said segment; and reconstructing the lattice model by using said segment having the calculated shape, and wherein said reconstructed lattice model is displayed at said display step.

18. An observation method according to claim 17, wherein said step of deriving the second equal thickness fringe comprises the steps of:

(a) preserving intensity distribution of a portion of an equal thickness fringe derived by setting said specimen at a certain angle with respect to said electron beam corresponding to a segment having a plane substantially parallel to said electron beam;

(b) changing the angle of said specimen and repeating said preserving step; and (c) combining preserved equal thickness fringes and forming said second equal thickness fringe, influence of said strain being removed in said second equal thickness fringe, wherein said step of analyzing composition of said specimen comprises the step of quantitatively analyzing composition of a portion of said second equal thickness fringe corresponding to said each segment on the basis of relations between changes of said second equal thickness fringe and changes of composition provided beforehand, and wherein said display step comprises the step of simultaneously displaying said analyzed composition of each segment of said specimen.

19. An observation method according to claim 17, wherein said lattice model is assumed by taking lattice strain relaxation in the vicinity of the surface of the specimen into consideration.

20. A method for observing composition and strain of a wedge-shaped specimen, comprising the steps of:

impinging a charged particle beam upon a cleavage plane of said specimen and transmitting said charged particle beam through said specimen;

observing a first dark-field image of said specimen by using said transmitted charged particle beam, said first dark-field image including a first equal thickness fringe;

detecting a change of said first equal thickness fringe while changing an angle of said cleavage plane of said specimen with respect to the charged particle beam impinged;

analyzing an angle distribution of a crystal lattice plane of said specimen, on the basis of the detected change of said first equal thickness fringe;

deriving a strained structure from said angle distribution;

referring to said angle distribution, controlling the angle of said specimen so as to impinge said charged particle beam upon said specimen at a predetermined angle with respect to the crystal lattice plane of said specimen, and deriving a bright-field image or a second dark-field image of said specimen by using the specimen thus controlled, said bright-field image or said second dark-field image including a second equal thickness fringe;

analyzing composition of said specimen on the basis of said second equal thickness fringe; and displaying at least one of said strained structure and composition of said specimen.

21. A method for observing composition and strain of a specimen, comprising the steps of:

processing said specimen into a wedge shape by means of cleaving;

impinging an electron beam upon a cleavage plane of said specimen and transmitting said electron beam through said specimen;

searching a first angle of said specimen with respect to said electron beam, said first angle searching step including the steps of:

(a) moving the cleavage plane of said specimen in such a direction as to change thickness of said specimen while keeping an angle of said cleaved plane with respect to said electron beam at a constant value, and searching such a position that a diffraction spot and a Kikuchi lines pattern thus derived are observed with substantially the same intensity; and (b) changing angle of said cleaved plane with respect to said electron beam in said searched position and searching the first angle at the time when a symmetry center of said diffraction spot substantially coincides with a symmetry center of said Kikuchi lines pattern;

impinging said electron beam upon a desired position of the cleavage plane of said specimen at said searched first angle, deriving first and second dark-field images represented by plane indexes having signs opposite to each other, and determining whether a first lattice plane on the desired position in said specimen is bended on the basis of a first equal thickness fringe of said first dark-field image and a second equal thickness fringe of said second dark-field image, said determining step including the step of judging said first lattice plane is bended when said first equal thickness fringe differs from said second equal thickness fringe and judging said first lattice plane is not bended when said first equal thickness fringe is substantially equal to said second equal thickness fringe;

detecting a change of a third equal thickness fringe of a third dark-field image in said desired position while changing the angle of said cleaved plane, when said first lattice plane has been judged to be bended at said determining step;

analyzing an angle distribution of a crystal lattice plane of said specimen, on the basis of the detected change of said third equal thickness fringe;

referring to the analyzed angle distribution, controlling the angle of said cleaved plane so as to impinge said electron beam upon said specimen at a predetermined angle with respect to the crystal lattice plane of said specimen, and deriving a first bright-field image or a fourth dark-field image of said specimen by using the specimen thus controlled, said first bright-field image or fourth dark-field image including a fourth equal thickness fringe;

impinging said electron beam upon said specimen in said desired position at said searched first angle when said first lattice plane has been judged to be not bended in said specimen at said determining step and deriving a second bright-field image or a fifth dark-field image, said second bright-field image or fifth dark-field image including a fifth equal thickness fringe;

analyzing composition of said specimen on the basis of said fourth or fifth equal thickness fringe; and displaying said angle distribution and composition of said specimen.

22. A method for impinging an electron beam upon a cleavage plane of a wedge-shaped specimen in parallel to a crystal lattice plane thereof, comprising the steps of:

moving the cleavage plane of said specimen in such a direction as to change thickness of said specimen while keeping an angle of said cleaved plane with respect to said electron beam at a constant value, and stopping scanning in such a position that a diffraction spot and a Kikuchi lines pattern thus derived are observed with substantially the same intensity; and changing angle of said cleaved plane with respect to said electron beam in said position and making a symmetry center of said diffraction spot substantially coincide with a symmetry center of said Kikuchi lines pattern, the electron beam being substantially parallel to said crystal lattice plane at that time.

* * * * *